United States Patent [19]

Ellis

[11] Patent Number: 5,105,857
[45] Date of Patent: Apr. 21, 1992

[54] SYSTEM FOR FORMING LEADS FOR SURFACE MOUNTED COMPONENTS

[75] Inventor: J. Gregg Ellis, Indian Harbour Beach, Fla.

[73] Assignee: Microtek Industries, Inc., Palm Bay, Fla.

[21] Appl. No.: 606,308

[22] Filed: Oct. 31, 1990

[51] Int. Cl.⁵ .................................................. B21F 1/00
[52] U.S. Cl. .................................. 140/105; 29/741; 72/36
[58] Field of Search .................. 140/105, 106; 29/740, 29/741; 33/712, 784, 832, 833, 836; 72/34, 36

[56] References Cited

U.S. PATENT DOCUMENTS

| | | | |
|---|---|---|---|
| 2,560,571 | 7/1951 | Hawkins | 33/833 |
| 3,796,201 | 3/1974 | Golub | 140/105 |
| 3,812,703 | 5/1974 | Tepper | 140/105 |
| 4,907,628 | 3/1990 | Corey et al. | 140/105 |
| 4,945,954 | 8/1990 | Wehrly, Jr. et al. | 140/105 |

FOREIGN PATENT DOCUMENTS 157717 6/1989 Japan ..................... 140/105

Primary Examiner—Lowell A. Larson
Attorney, Agent, or Firm—Evenson, Wands, Edwards, Lenahan & McKeown

[57] ABSTRACT

A surface mount technology measurement and lead formation system provides high precision bending and trimming of offset leads for both two and four sided circuit components. A total form height includes a pair of horizontally adjustable support rails which support the leads of a component. A precision, linear displacement measuring device engages the body of the electronic component and provides a digital indication of the total form height of the leads of the component. The lead forming apparatus has a total form height adjustment mechanism through which the total form height of the leads of the component are controllably bent and trimmed. The total form height of the leads is preset by an operator, who manually adjusts a form height setting anvil, a control dial for which is coupled to an associated digital readout gage which conforms with the same units of the digital readout gage of the total form measuring device. The lead forming apparatus comprises upper and lower support platens upon which bending and trimming tooling elements are mounted.

36 Claims, 9 Drawing Sheets

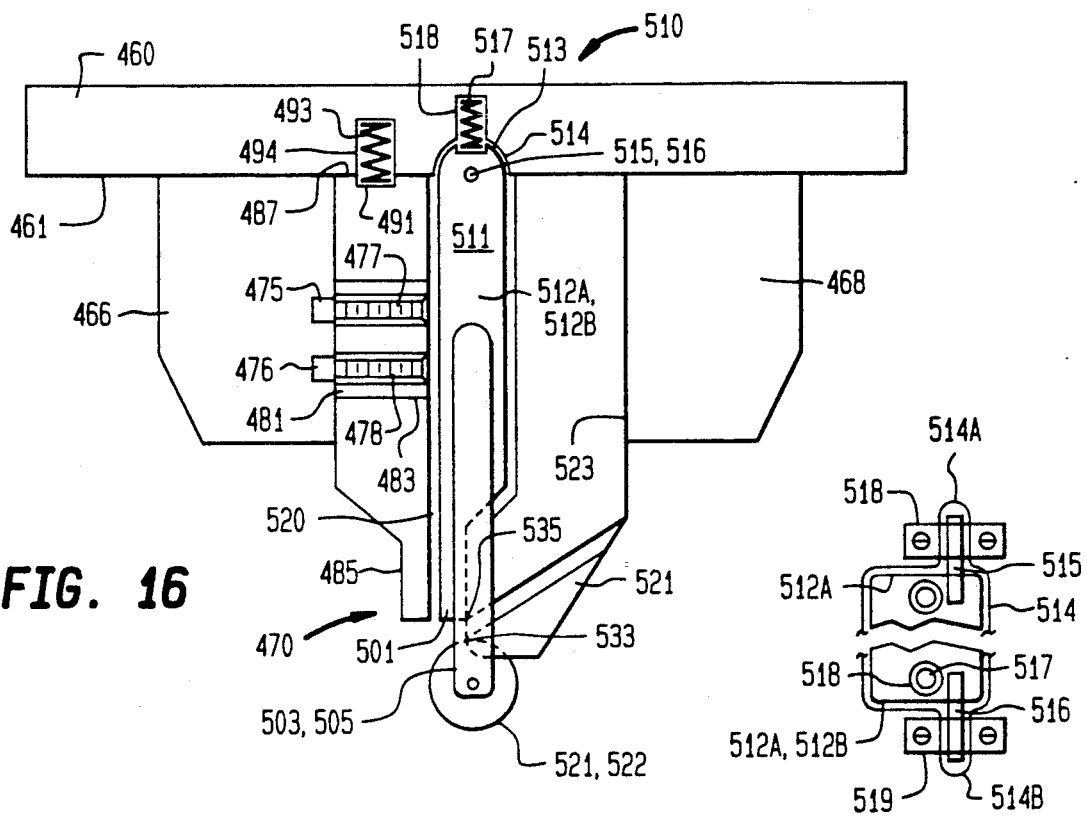
FIG. 16
FIG. 17
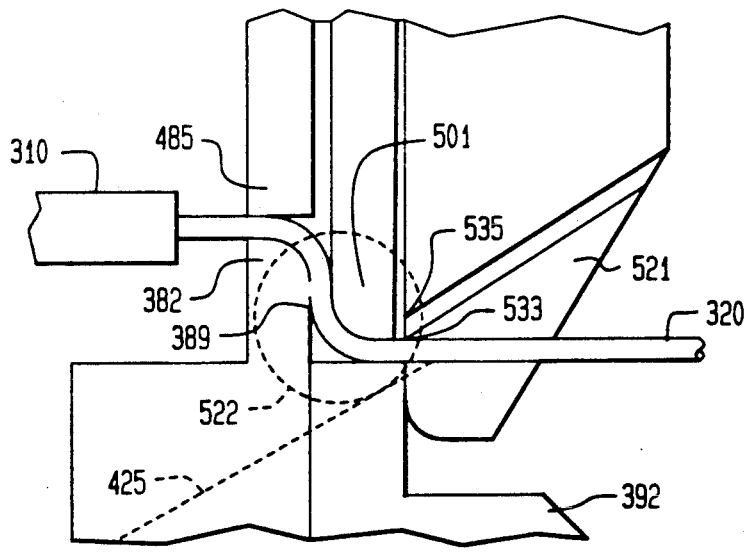
FIG. 18

SYSTEM FOR FORMING LEADS FOR SURFACE MOUNTED COMPONENTS

FIELD OF THE INVENTION

The present invention relates in general to the assembly of electronic printed circuit boards and is particularly directed to a system for carrying out high precision bending (or forming) and trimming of offset (or gull-wing) leads for surface mounted electronic components.

BACKGROUND OF THE INVENTION

As continuing refinements in micro-miniaturization techniques have increased the component occupancy densities of printed circuit boards, misalignment and imprecise shaping or formation of component leads have become significant concerns of system manufacturers, particularly those employing surface mount devices such as narrow pitch leaded chip carriers. At present there are essentially two lead forming schemes—complex, high volume processor-controlled system designed to handle a large number of parts for repetitive high density manufacturing runs, and custom-tailored, low end devices dedicated for use with a limited number of specifically configured components. However, as diverse technology industries continue to employ larger numbers of electronic control and sensor equipment, board assembly manufacturers currently have a need for an intermediate level of surface mount component lead forming device that can be adapted for use with both automated (e.g. robotic) and customized manually adjustable assembly systems.

SUMMARY OF THE INVENTION

In accordance with the present invention, the above need is addressed by a reduced complexity component measurement and associated lead formation system that provides high precision bending and trimming of offset leads for both two and four sided surface mount electronic circuit components. For this purpose, the present invention includes a total form height measuring apparatus which measures the total form height of leads of an electronic component to be surface mounted to a printed circuit board, and an associated lead forming apparatus through which the leads of the electronic component are controllably bent and trimmed to faithfully conform with total form height measurement.

The total form height measuring apparatus is a manually operated device which includes a pair of horizontally adjustable, spaced apart support rails which support the leads of an electronic component placed on the measuring apparatus by an operator. A precision, linear displacement measuring device is mounted between the support rails and engages the bottom of the body of the electronic component. The measuring device contains a digital readout gage which, when calibrated in accordance with a predefined separation between the body of the electronic circuit component and a surface upon which the component is to be mounted, provides a digital indication of the total form height of the leads of the component.

The lead forming apparatus has a total form height adjustment mechanism through which the total form height of the leads of the component are controllably bent and trimmed. The total form height of the leads is preset by an operator, who manually adjusts a control dial which is coupled to an associated digital readout gage which conforms with the same units of the digital readout gage of the total form measuring device. The lead forming apparatus comprises upper and lower support platens upon which bending and trimming tooling elements are mounted.

In accordance with a first embodiment of the invention, mounted on the lower support platen is a vertically adjustable anvil having first and second spaced apart support rails which support the leads of an electronic component placed on the anvil by an operator. A pair of lead-contouring surface blocks are mounted to the lower platen abutting opposite sides of the anvil, so that one support rail is vertically displaced above one lead-contouring surface block and the other support rail is vertically displaced above the other lead-contouring surface block, whereby a gull-wing lead shaping surface is created.

The vertically adjustable anvil comprises a first, vertically displaceable anvil block on the top surface of which the spaced apart support rails are formed. Its lower surface is inclined and is spring biased against an inclined support surface of a horizontally displaceable height adjustment wedge member, which is located within a groove or slot in the lower support platen. A pair of guide blocks are supported on the lower platen adjacent to the lead-contouring surface blocks, so as to confine movement of the vertically displaceable anvil block to the vertical direction.

A digital gage is coupled to a dial for controlling the horizontal displacement of the height adjustment wedge. This gage provides a digital indication of the total form height to be imparted to the leads of an electronic component placed on the support rails of the anvil. As a consequence, when the operator dials in the value read off the digital gage of the total form height measuring device and thereby causes horizontal displacement of the (inclined support surface of) height adjustment member, the anvil block is vertically displaced to the correct lead formation height.

To facilitate release or ejection of the component from the anvil, the anvil further comprises a vertically displaceable component release member. This release member, or ejector, is supported for vertical displacement within the anvil block and is arranged to be controllably vertically displaced between the support rails of the anvil. Pivotally coupled with the component release member is an ejection lever. When the lever is pressed down, the ejector is vertically displaced, causing the component to be lifted off the support rails of the anvil.

To hold the component in place during lead formation and trimming and to provide strain relief on the leads, a lead clamping unit is mounted to the upper support platen directly above the anvil. The lead clamping unit has a pair of clamping elements aligned with the support rails of the anvil, so that when the lead clamping unit is urged downwardly against the anvil, its clamping members clamp the leads of an electronic circuit component supported on the anvil's support rails.

A lead forming and trimming unit is mounted to the upper support platen, and contains a pair of die members arranged adjacent to the clamping members. When the lead clamping unit engages the anvil, further downward movement of the upper platen causes the die members to engage the unclamped ends of the leads and bend the leads along the sides of the anvil and into contact with the lead-contouring surface members, thereby shaping the leads into a gull-wing configuration. The outer corners of the support rails and inner corners of the die members have a gently rounded curvature corresponding to a prescribed curvature of bend of the leads.

To trim the leads, a pair of cutting blades are supported on the upper platen adjacent to the die members. Once the leads have been bent into their gull-wing shape, continued downward movement of the upper platen brings the cutting blades down onto the free ends of the bent leads that extend beyond formed portions.

In accordance with a second embodiment of the invention, either dual in-line packages or packages having leads extending from all four sides may be processed. Pursuant to this embodiment, mounted on the lower support platen is a vertically adjustable anvil having a first support rail upon which leads extending from a first side of an electronic component may be placed. A horizontally adjustable lead support member, mounted on a translatable shuttle, is mounted to the lower support platen. For handling a dual in-line package, this lead support member has a second support rail upon which leads extending from a second side of an electronic component are placed, so that the body of the electronic component may be supported between the first and second support rails with one side of the component pushed up against the second support rail. For components with four side leads, the horizontally adjustable lead support member contains a pair of spaced apart lead support rails arranged to support leads extending from a second side of the component in a direction generally transverse to the direction of leads extending from the first side of the component, rather than at the opposite side of the component body. A lead-contouring surface member abuts the anvil such that it is vertically displaced beneath the first support rail.

Mounted adjacent to the anvil and the lead-contouring surface member is a lead forming unit guidance block. Guidance block has an inclined guiding surface along which a lead forming unit mounted to an upper platen travels during downward movement of the upper platen toward the anvil. As a result, a die member is guided toward the anvil and lead-contouring surface member, such that, as the lead clamping unit engages the lead forming unit guidance block, the die member is guided into zero clearance engagement against free ends of clamped leads and bends the free ends of the leads against a side of the anvil and into contact with the lead-contouring surface member.

More particularly, just as in the first embodiment, mounted to an upper support platen above the anvil is a lead clamping unit. The lead clamping unit includes a lead clamping member aligned with the first support rail of the anvil, such that when the lead clamping unit is urged against the anvil, the lead clamping member is urged against and clamps leads of an electronic circuit component resting on the first support rail. A lead forming unit is also mounted to the upper support platen. The lead forming unit includes a die member arranged adjacent to the lead clamping member. The die member is pivotally attached to the upper support platen and includes a pair of guide wheels which ride on the inclined guiding surface of the lead forming unit guidance member, so as to impart a horizontal movement of the die member during downward translation of the upper platen toward the anvil. As the wheels travel down the lead forming unit guidance block, the die member is urged into a zero clearance contact with free ends of clamped leads and bends the free ends of the leads against a side of the anvil and into contact with the lead-contouring surface member, thereby forming each of the clamped leads into a gull-wing configuration.

To trim the leads, a cutting blade is supported on the upper platen adjacent to the die member. Once the leads have been bent into their gull-wing shape, continued downward movement of the upper platen brings the cutting blade down onto the free ends of the bent leads that extend beyond formed portions.

BRIEF DESCRIPTION OF THE DRAWINGS

FIG. 16 shows lead clamping, bending and trimming components which are mounted upon an upper platen of a second embodiment of the present invention;

FIG. 17 is an enlarged partial bottom view of FIG. 16; and

FIG. 18 shown in enlarged detail how a lead forming member is urged into 'zero clearance' contact with free ends of leads clamped by a lead clamp and the free ends of the leads are bent, thereby forming the clamped leads into a gull-wing configuration.

DETAILED DESCRIPTION

Figure 1:
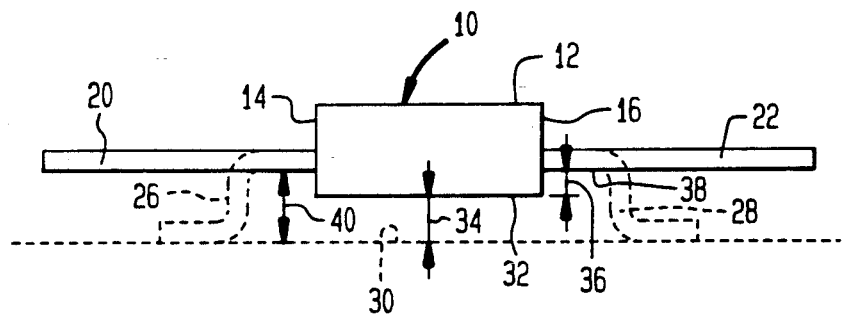
FIG. 1 diagrammatically illustrates an exemplary dual in-line component having leads to be formed into a gull wing or Z configuration.

As pointed out briefly above, the present invention is directed to a reduced complexity component measurement and lead formation system that provides high precision bending and trimming of offset leads for both two and four sided surface mount electronic circuit components. For purposes of the present description, FIG. 1 diagrammatically illustrates an exemplary dual in-line package or component 10 as having a body 12 from opposite sides 14 and 16 of which respective leads 20 and 22 extend. Also show; in broken line form are gull wing or Z configurations 26 and 28 into which leads 20 and 22 are to be respectively formed or bent for surface mounting of the component to a printed circuit board 30. In its intended mounted configuration relative to printed circuit board 30, the leads of component 10 are shaped so that the bottom 32 of component 10 is displaced a prescribed distance or height 34 above board 30. In many instances where intimate thermal communication between the component and the support substrate is required, this distance will be zero. Because of manufacturing variations among different batches of components, the distance 36 between the bottom 38 of the leads and the bottom 32 of the component may vary. Consequently, in order for leads to be properly formed, the total form height 40 between the bottom 38 of the leads and the board 30 must be correct.

Figure 2:
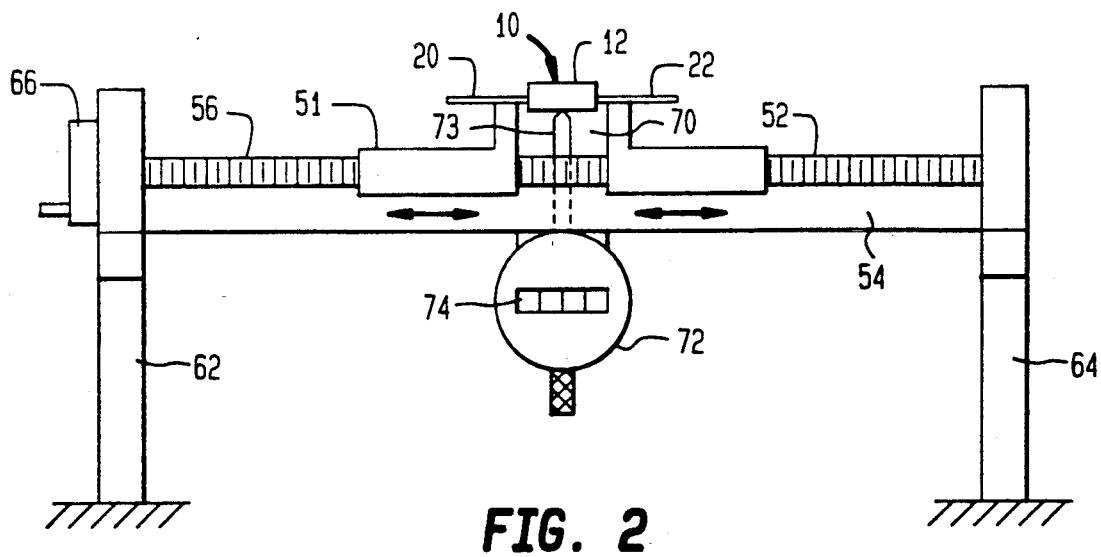
FIG. 2 is a diagrammatic side view of a total form height measuring apparatus.

Pursuant to the present invention, the distance 36 between the bottom 38 of the leads and the bottom 32 of the component is measured and summed with a desired offset 34 between the bottom 32 of the component and the surface of the printed circuit board 30. The resulting value is the total form height of the leads 20 and 22 in their formed configurations 26 and 28 that will assure that the component will be correctly surface mounted to the printed circuit board. For this purpose, the total form height measuring apparatus, a side view of which is diagrammatically illustrated in FIG. 2, is used.

More particularly, the total form height measuring apparatus is a manually operated device which includes a pair of horizontally adjustable, spaced apart support rail members 51, 52 which ride upon a support track 54 and are horizontally displaceable relative to one another by means of lead screw 56 journalled through rail members 51 and 52. The support track 54 and lead screw 56 are mounted at their opposite ends to a pair of support stanchions 62 and 64. An adjustable hand crank 66 is coupled to lead screw 56 for permitting an operator to manually adjust the separation between support rail members 51 and 52 so that the a gap 70 between the rails will just accommodate the body of an electronic circuit package, whereby leads 20, 22 that extend from opposite sides of the component 10 will rest on rails 51, 52 in very close proximity to the component body 12, thereby permitting an accurate measurement of the distance between the bottom of the leads and the bottom of the component.

Mounted generally centrally of track 54, so that it is located directly beneath the separation gap 70 between rail members 51 and 52 is a precision, linear displacement measuring device 72, such as a Model IDC-1012 ME, manufactured by Mitutoyo Corp., which has a vertical probe 73 that engages the bottom of an electronic component that has been placed upon the rails. Measuring device 72 contains a digital readout gage 74 which, when preset or calibrated in accordance with a predefined offset 34 between the bottom of the electronic circuit component and a (printed circuit board) surface upon which the component is to be mounted, provides a digital indication of the total form height 40 of the leads of the component. Namely, with vertical probe 73 of measurement device 72 contacting the bottom of a component whose leads rest upon rails 51, 52, device 72 measures the distance 36 between the bottom of the component and the bottom of the leads, as shown in FIG. 1, described above. Presetting the readout with a desired offset distance 34 (FIG. 1) results in the gage 74 indicating the total form height to which the leads must be bent. As will be described below, this read-out value is then simply dialed in an associated control dial/gage of a lead forming device to precisely preset the total form height to which the leads of the component will be formed as they are bent into an intended gull wing or Z configuration.

Figure 3:
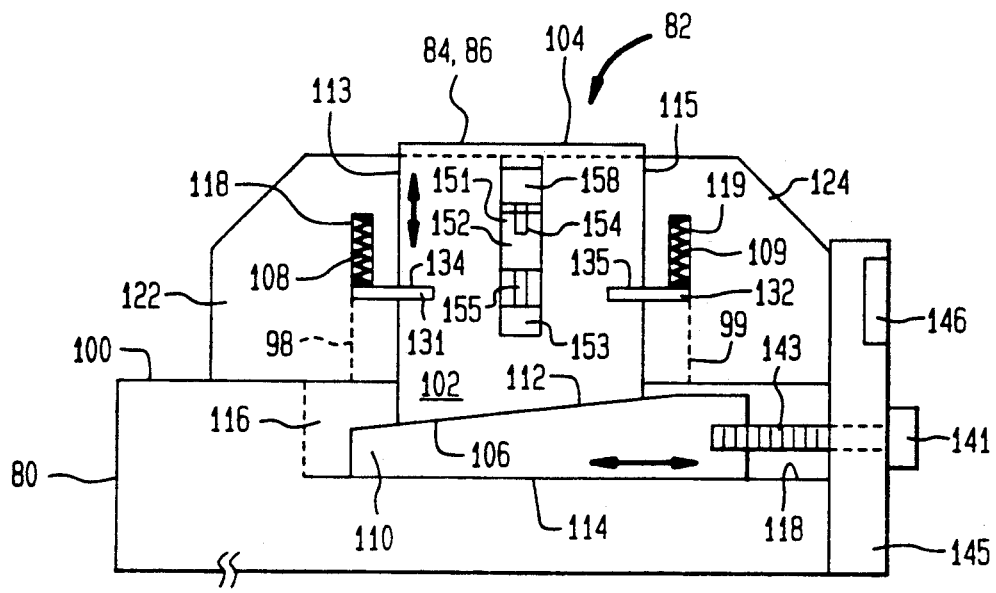
FIGS. 3 and 4 are respective front and side diagrammatic views of the lower portion of the lead forming apparatus of a first embodiment of the present invention.
Figure 4:
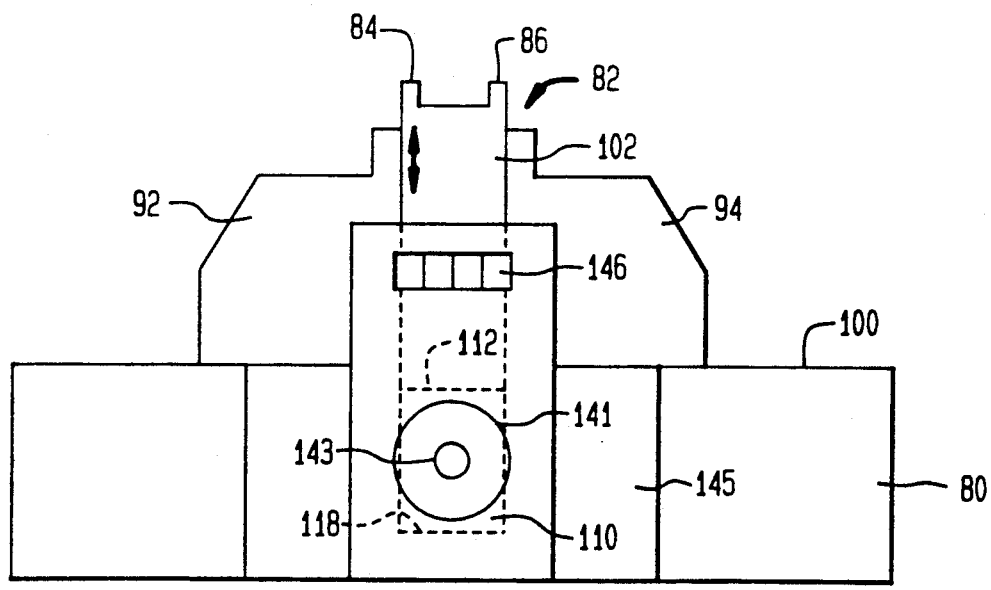
Figure 5:
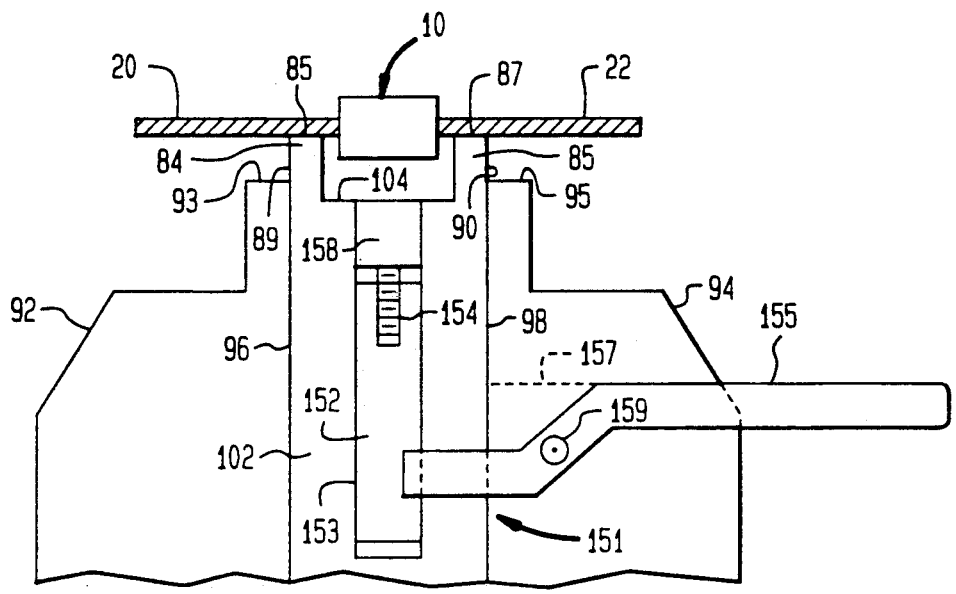
FIG. 5 shows in enlarged detail the structure of the anvil of the lead forming apparatus of FIGS. 3 and 4.

Referring now to FIGS. 3 and 4 respective front and side diagrammatic views of the lower portion of the lead forming apparatus of a first embodiment of the present invention show a lower support platen 80 upon which a vertically adjustable anvil 82 is mounted. As shown in enlarged detail in FIG. 5, anvil 82 has first and second spaced apart support rails 84, 86, which support the leads 20, 22 of an electronic component 10 that has been placed on the anvil by an operator. A pair of lead-contouring surface blocks 92, 94 are mounted to the top surface 100 of lower platen 80 abutting opposite sides 96, 98 of the anvil, so that the top surface 85 of support rail 84 is vertically displaced by a side surface portion 89 above a land region 93 of lead-contouring surface block 92; similarly, the top surface 87 of support rail 86 is vertically displaced by a side surface portion 90 above a land region 95 of lead-contouring surface block 94, thereby defining a gull-wing lead shaping surface, with the distance between top surfaces 85, 87 and land regions 93, 95 corresponding to the total form height 40 shown in FIG. 1.

Vertically adjustable anvil 82 is formed of a vertically displaceable anvil block 102 at the top surface 104 of which the spaced apart support rails 84 and 86 are formed. As shown in FIG. 3, its lower surface 106 is inclined relative to its top surface 104 and is spring biased by a pair of springs 108, 109 against an inclined upper support surface 112 of a horizontally displaceable height adjustment wedge member 110, the bottom surface 114 of which is supported on the bottom horizontal surface 118 of a groove or slot 116 in lower support platen 80. Compression springs 108, 109 are captured in respective cylindrical cavities 118, 119 in a pair of guide blocks 122, 124. Guide blocks 122, 124 are supported on lower platen 80 adjacent to lead-contouring surface blocks 92, 94, and abut end surfaces 113, 115 of anvil block 102, so as to confine movement of anvil block 102 to the vertical direction. Each of guide blocks 122, 124 has a respective slot 98, 99 into which respective pins 131 132 project from bores 134, 135 journalled in opposite end surfaces 113, 115 of anvil block. Pins 131 and 132 are respectively aligned with springs 108 and 109 so that the springs provide a downward bias against the pins and thereby maintain lower inclined surface 106 of anvil block 102 in intimate contact with upper inclined surface 112 of horizontally displaceable height adjustment wedge member 110.

Horizontal displacement of height adjustment wedge member 110 is controlled by way of a dial 141 which is coupled to one end of a threaded coupling shaft 143 at a dial mount block 145. The other end of threaded coupling shaft 143 engages wedge member 110. A digital gage 146 is coupled to dial 141 and is calibrated in the units of the total form height to be imparted to the leads of an electronic component placed on support rails 84, 86 of the anvil. When an operator dials in the value read indicated by digital gage 74 of the total form height measuring device shown in FIG. 2, rotation of the dial 141 and threaded coupling shaft causes horizontal displacement of the (inclined support surface 112 of) height adjustment wedge member 110, so that the anvil block 102 is vertically displaced to the correct 'dialed-in' lead formation height.

Figure 6:
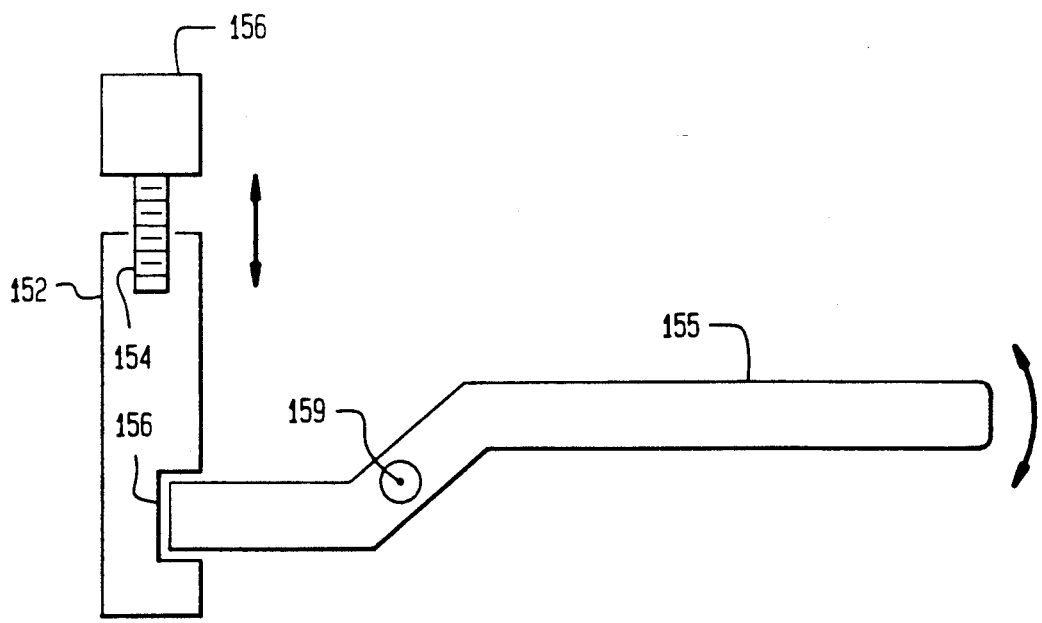
FIG. 6 shows the details of a component ejector.

To facilitate release or ejection of a processed component from the anvil, the anvil further comprises a vertically displaceable component release member or ejector 151 supported within a vertical bore 153 of anvil block 102 directly beneath the location between support rails 84 and 86 where the component body has been placed. Ejector 151, which is also shown separately in FIG. 6, is comprised of a generally cylindrical body 152 having a bore 154 at its top or upper end. An adjustable 'cap' piece 158 is threaded into bore 154 for adjusting the length of the ejector to accommodate varying sized components. Ejector 151 has a detent region 156 which is engaged by one end of an ejection lever 155. Ejection lever 155 extends through a slot 157 in guide block 94 and is pivotally mounted for rotation about a pin 159 captured within a recess (not shown) within block 94. When ejection lever is pressed down, it is rotated clockwise as viewed in FIGS. 5 and 6, causing ejector 151 to be displaced upwardly into contact with the bottom of the component, so that the component is lifted off the support rails of the anvil.

Figure 7:
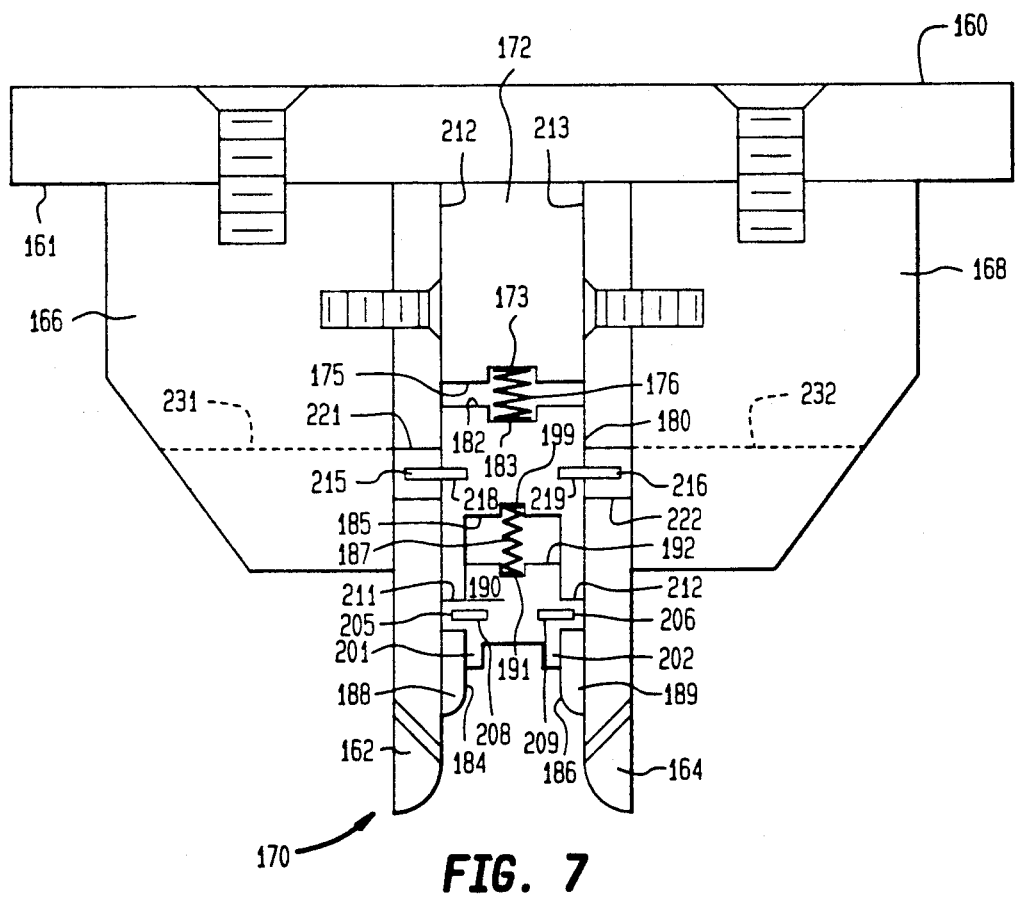
FIG. 7 is a front view of the configuration of the upper platen portion of the lead forming system of a first embodiment of the invention.

Referring now to FIG. 7, which is a front view of the configuration of the upper platen portion of the lead forming system, located directly above and supported for controlled vertical displacement with respect to lower platen 80 is an upper platen 160 to which clamping, die and lead cutting elements of the system are mounted. The clamping and die elements are contained with a lead clamping/forming unit 170 that effectively 'floats' between a pair of load cutting elements 162, 164 and upper platen mounting blocks 166, 168 to which lead cutting elements 162, 164 are fixedly bolted. The upper platen mounting blocks 166, 168 are bolted to upper platen 160.

Lead clamping/forming unit 170 is comprised of a base block 172 which abuts the bottom surface 161 of upper platen 160 and has an arrangement of cylindrical depressions 173 in its bottom surface 175 which receive respective Belleville spring washers 176. An elongated, generally U-shaped lead forming block 180 has a corresponding set of cylindrical depressions 183 in its top surface 182 which capture and compress the lower portions of spring washers 176. Along the bottom interior surface 185 of lead forming block 180 a further set of cylindrical depressions 199 is provided to receive compression springs 187, lower ends of which are accommodated within a set of cylindrical depressions 191 in the upper surface 192 of a generally U-shaped lead clamping block 190 that is sized to fit between die rails 188, 189 of lead forming block 180.

Lead clamping block 190 has a pair of clamping rails 201, 202 that abut and slide along the interior surfaces 184, 186 of die rails 188, 189 of lead forming block 180. Clamping rails 201 and 202 are aligned with support rails 84, 86 of the anvil. Lead clamping block 190 is retained between the interior surfaces 184, 186 of die rails 188, 189 of lead forming block 180 by a pair of pins 205, 206, that are captured in respective bores 208, 209 of clamping block 190 and cooperate with and travel within a pair of elongated slots 211, 212 in die rails 188, 189 of leads forming block 180 to define the extent of vertical displacement of lead clamping block 190 relative to lead forming block 180.

Lead forming block 180, in turn, is retained between the interior surfaces 212, 213 of lead cutting elements 162, 164 by a pair of pins 215, 2)6, that are captured in respective bores 218, 219 of lead forming block 180 and cooperate with and travel within a pair of elongated slots 221, 222 in lead cutting elements 162, 164 to define the extent of vertical displacement of lead forming block 180 relative to lead cutting elements 162, 164. Respective bores 231 and 232 in upper platen mounting blocks 166 and 168 are aligned with elongated slots 221 and 222 within lead cutting elements 162 and 164 to permit insertion of pins 215 and 216 in the course of assembly of the system. Lead cutting elements 162, 164 have recessed lead cutting blades 241, 242 that are inclined from lower edges 243, 244, to upper edges 251, 252.

Figure 8:
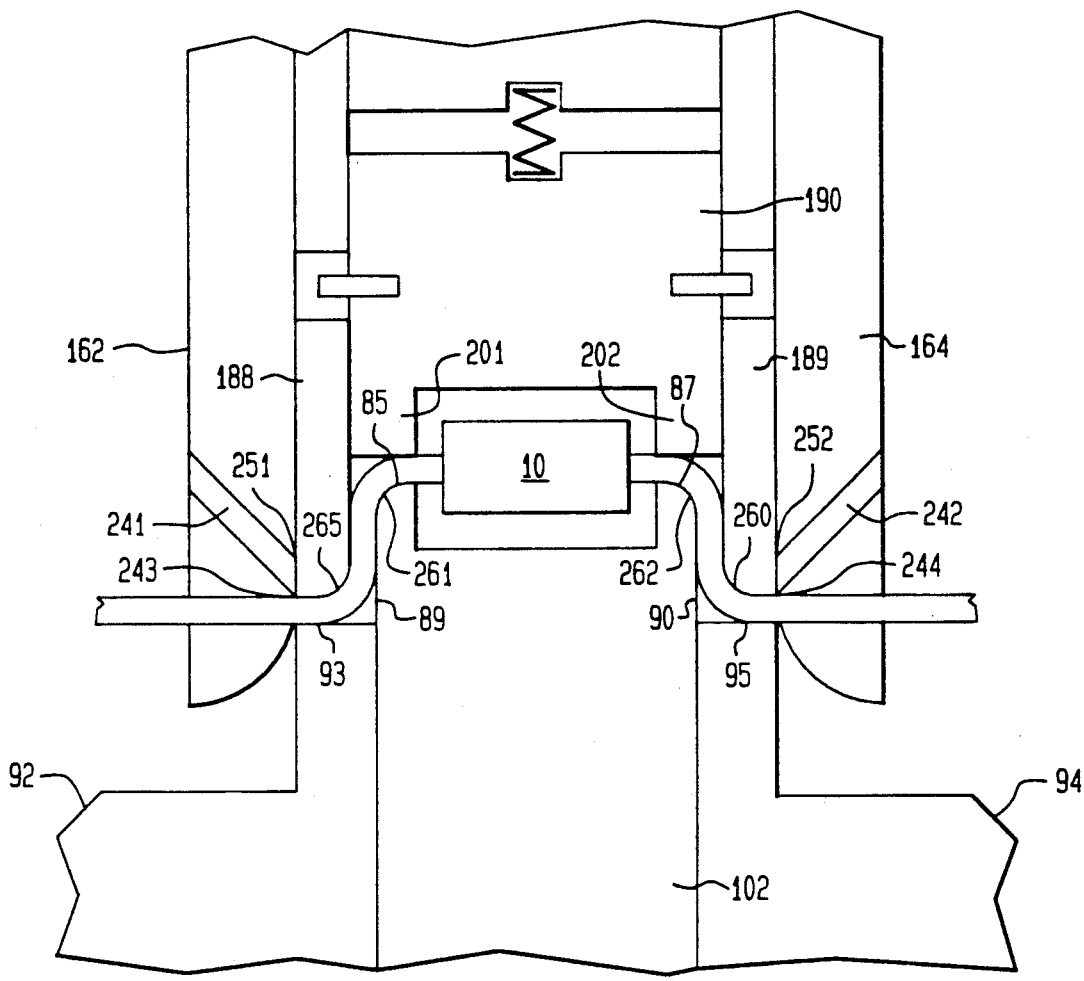
FIG. 8 diagrammatically illustrates the manner of operation of a lead clamping/forming unit.

The manner of operation of the lead clamping/forming unit 170 is diagrammatically illustrated in FIG. 8. As shown therein, when upper platen 160 is urged downwardly toward the lower platen 80, clamping rails 201, 202 of lead clamping block 190 come to bear against and clamp the leads 20, 22 of an electronic circuit component supported on the support rails 84, 86 of anvil block 102. Once the rails 201, 202 of lead clamping block 190 have clamped the leads against the support rails of the anvil, further downward movement of the upper platen compresses springs 187 between lead clamping block 190 and lead forming block 180 to provide strain relief on the clamped leads as the upper platen and thereby lead forming block 180 continue to move downward.

With clamping rails 201, 202 of clamping block 190 now stationary against leads 20, 22, die rails 188, 189 slide past clamping block 190 and engage the unclamped ends of leads 20, 22, thereby bending the leads downwardly along the vertical sidewalls 89, 90 of the anvil block and into contact with the land regions 93, 95 of lead-contouring surface members blocks 92, 94, respectively, and shaping the leads into a gull-wing configuration. As shown in the enlarged detail of FIG. 8, the outer corners 261, 262 of the anvil support rails 84, 86 and inner corners 265, 266 of the die rails 201, 202 are gently rounded corresponding to a prescribed curvature of bend of the leads.

With the leads now bent into their gull-wing shape, continued downward movement of the upper platen compresses spring washers 176 between lead forming block 180 and base block 172 to provide strain relief on the formed leads as cutting blade elements 162, 164 slide past base block 172 and lead forming block 180. Namely, with die rails 188, 189 stationary against bent leads 20, 22, cutting die rails 188, 189 slide past lead forming block 180 and blades 241, 242 engage the unclamped ends of leads 20, 22, thereby severing those portions of the leads that extend beyond their gull wing configured portions. Once the leads have been formed and trimmed in the manner just described, upper platen 160 is retracted, so that the component may be ejected from the anvil and a new component processed.

Figure 9:
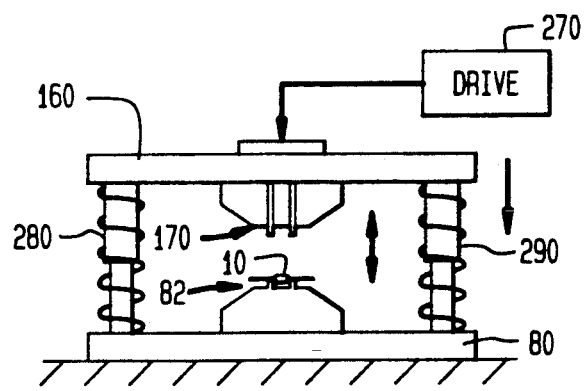
FIG. 9 shows, in general mechanical schematic form, the manner in which an upper platen is supported for vertical translation with respect to a lower platen.

FIG. 9 shows, in general mechanical schematic form, the manner in which upper platen 160 is supported for vertical translation with respect to lower platen 80 therebeneath by way of a set of guide columns posts and associated cylindrical compression springs 280 and 290 so that the lead clamping, forming and cutting elements supported by the upper platen may controllably engage the component 10 supported on anvil 82. A conventional operator-controlled mechanical, pneumatic or electromagnetic drive unit 270 is coupled to upper platen 160 for this purpose. Lower platen may further contain a suitable stop member (not shown) to limit downward excursion of upper platen. As the details of these displacement control components are conventional no further description will be provided here.

Figure 10:
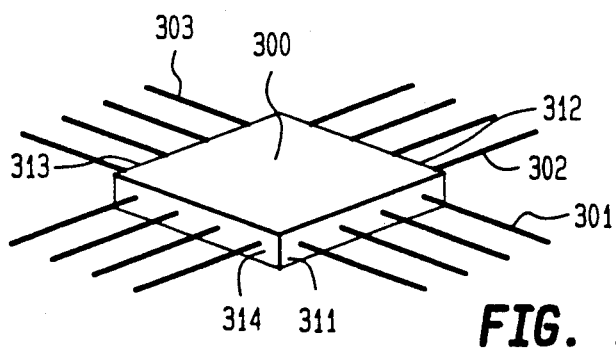
FIG. 10 diagrammatic illustrates, in perspective, an exemplary component having plural sets of leads extending from four respective sides of the package.

As noted earlier, in addition to forming and trimming leads that extend from only two (opposite) sides of an electronic component, the present invention provides the capability of high precision bending and trimming of offset leads for four-sided surface mount electronic circuit components. FIG. 10 diagrammatic illustrates, in perspective, an exemplary component 300 having leads plural sets of leads 301, 302, 303 and 304 extending from four respective sides 311, 312, 313 and 314 of the package. As in the case of a component having two-sided leads, each set of leads is to be formed into a gull wing or Z configuration for surface mounting the component to a printed circuit board.

In accordance with a second embodiment of the invention, the lead clamping, forming and cutting assembly of the first embodiment is modified so that either two-sided lead packages or packages having leads extending from all four sides may be processed. Pursuant to this embodiment, total offset measurements for respective pairs of opposed leads are performed using the measurement apparatus shown in FIG. 2, described above. However, rather than form and cut the leads in pairs, the leads are formed and cut, one side of the component at the time.

Figure 11:
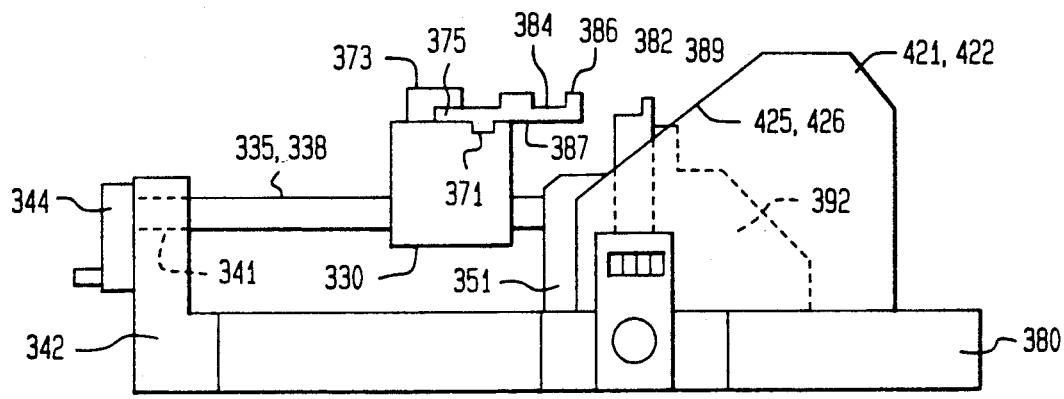
FIG. 11 is a diagrammatic side view of the lower portion of the lead forming apparatus of a second embodiment of the present invention.

More particularly, with reference to FIG. 11, which is a diagrammatic side view of the lower portion of the lead forming apparatus of second embodiment of the present invention, a vertically adjustable anvil 382 is mounted upon a lower support platen 380. As shown in enlarged detail in FIG. 12, unlike the dual rail anvil of the first embodiment anvil 382 has only a single lead support rail 384 which supports one set of leads that extend from one side of the component body 310. For a component having two sets of leads, one set 320 is supported by anvil support rail 384 and the other set 322 is supported by a support rail 386 of a lead support member 387, which is mounted on a horizontally translatable and vertically adjustable shuttle 330.

Figure 12A:
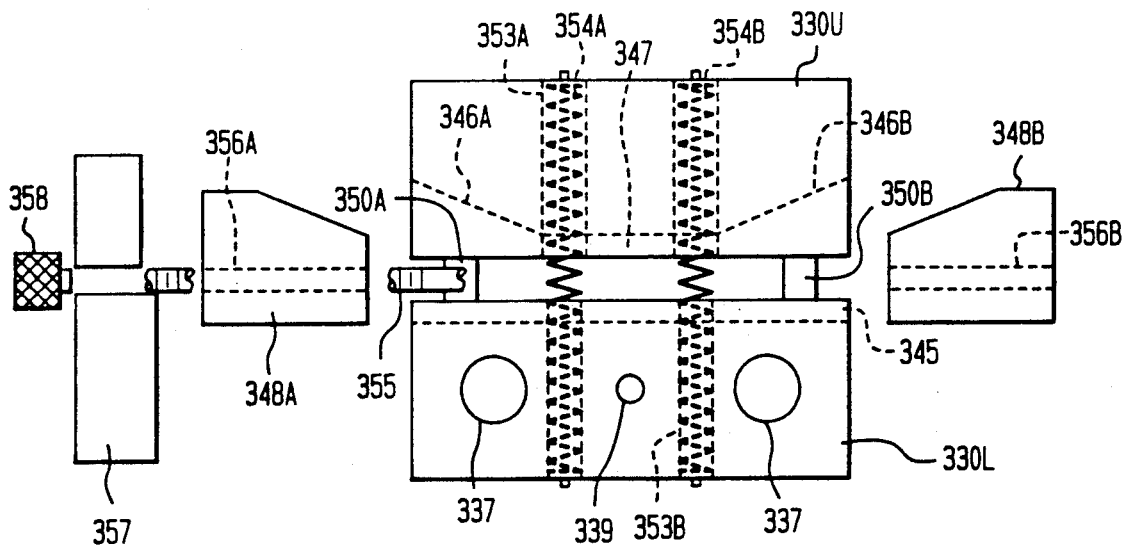
FIG. 12A diagrammatically illustrates the details of an adjustable rail shuttle.
Figure 12:
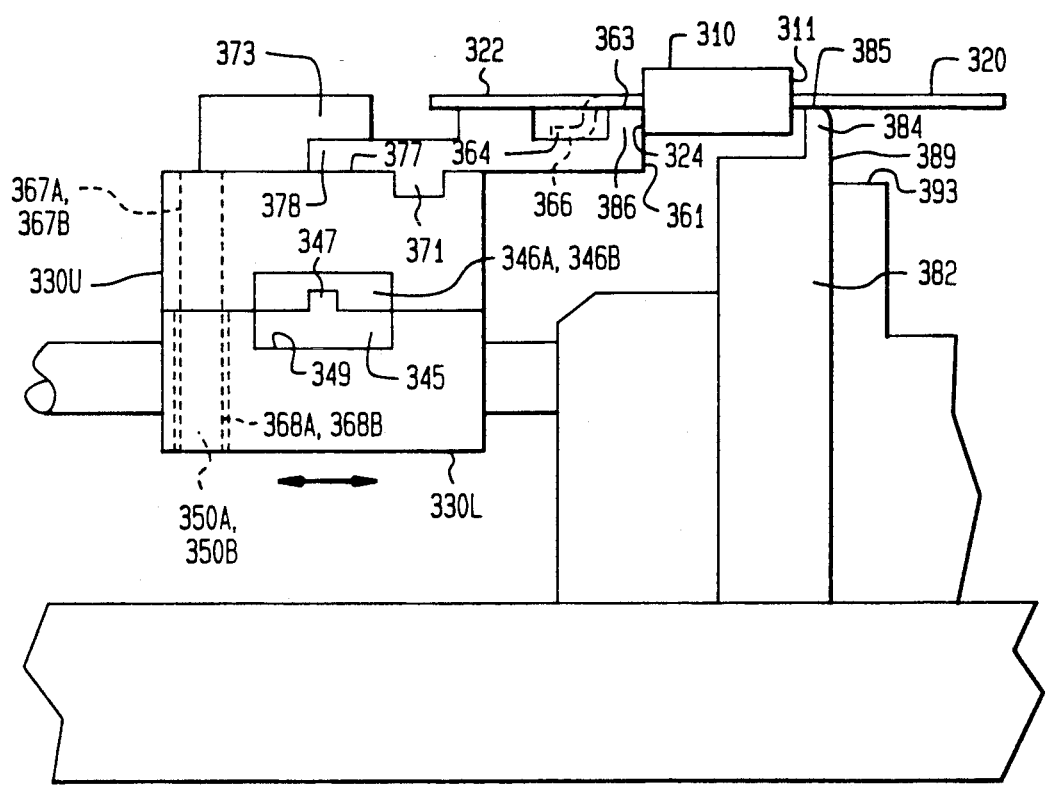
FIG. 12 shows, in enlarged detail, a single rail anvil of the second embodiment of the invention.

Shuttle 330, the details of the vertical adjustability of which are shown by way of an end view in FIG. 12A, is translatably supported by means of a pair of carriage rods 335, which pass through bores 337 of a lower shuttle block 330L. A threaded rod 338 is coupled to a threaded bore 339 in lower shuttle block 330L and is coupled via bore 341 in an end stanchion 342 to a manually adjustable crank 344. Similarly, carriage rods 335 are supported by each of stanchion 342 and shuttle carriage mount block 351. Rotation of crank 344 turns threaded carriage rod 338 and thereby horizontally translates the shuttle along rods 335.

An upper shuttle block 330U is mounted to support posts 350A and 350B which pass within bores 367A and 367B, respectively. Posts 350A and 350B are supported in bearings 368A, 368B in corresponding bores in lower shuttle block 330L. Located generally centrally within lower shuttle block 330L is a slot 345 having a generally horizontal floor 349. Slot 345 faces a corresponding slot 347 within upper shuttle block 330U. Slot 347 has a pair of inclined slot regions 346A and 346B at opposite ends thereof for engaging the inclined surfaces of a pair of wedge members 348A and 348B, which ride on floor 349 of slot 345 in the lower shuttle block 330L. Each wedge member has a counter-threaded bore 356A, 356B into which a corresponding counter-threaded rod 355 is threaded. Rod 355 is retained in a bore within a face plate 357 and is rotatably adjustable by means of a knurled knob 358, so as to cause wedge members 348A and 348B to be drawn toward each other or displaced further apart depending upon the clockwise or counterclockwise rotation of knob 358. When wedge members 348A, 348B are drawn together, the vertical separation between upper and lower shuttle blocks 330U, 330L is increased. Conversely, when wedge members 348A, 348B are displaced further apart, the vertical separation between upper and lower shuttle blocks 330U, 330L is decreased, thus adjusting the height of a lead support rail to accommodate variations in anvil height. Bores 353A, 353B through each shuttle block receive compression springs 354A, 354B which are fixed at the upper and lower surfaces of the shuttle to bias the shuttle blocks toward one another and thereby maintain the inclined surfaces of slot regions 346A, 346B in contact with wedge members 348A, 348B.

As noted above with reference to FIG. 12, for supporting a component having two sided leads, lead support member 387 has a support rail 386 upon which leads 322 extending from one side 324 of an electronic component 310 are placed so that the component may be supported between anvil support rail 384 and shuttle-borne support rail 386. When the component is placed upon the support rails, side 324 of the component is pushed up against the front edge 361 of support rail 386, with leads 322 resting on the top land surface 363 of the support rail. Adjacent to support rail 384 is a removed region 364 for accommodating bent portions of previously formed leads, as shown by dotted lines 366. Lead support member has a dado joint 371 with shuttle 330 and is held in place by a topside clamp piece 373 which is bolted to the top surface of the shuttle and thereby clamps an end region 375 of lead support member against the top surface 377 of the shuttle.

Figure 13:
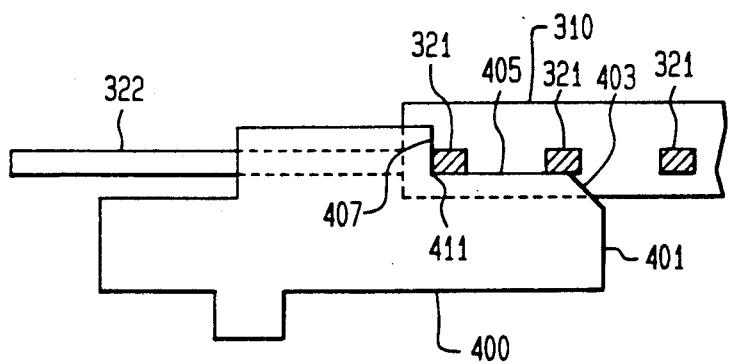
FIG. 13 shows the configuration of a lead support member for components with four side leads.
Figure 14:
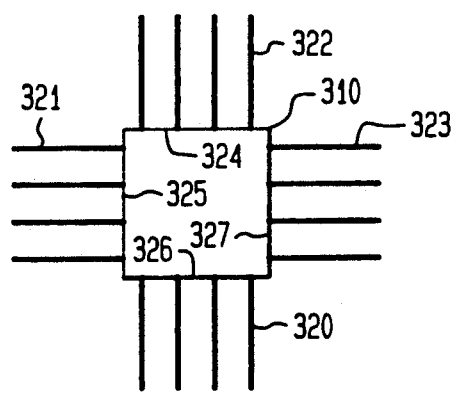
FIG. 14 diagrammatically shows an example of the non-parallel geometry of a component with a four sided lead structure.

For components with four side leads, the lead support member is configured in the manner shown in FIG. 13, so as to abut against component leads 321 rather than a side surface 324 of the component body from which leads 321 extend. Namely, as diagrammatically shown in FIG. 14, it is sometimes the case that the geometry of the four sides of the body is not precisely rectangular or square, so that leads cannot be accurately aligned for bending and trimming using the sides of the body as a reference.

Typically, the body is potted around a lead frame, the geometry of which is well defined, so that using the leads as a formation reference is considerably more reliable than using the body. Consequently, for four-sided lead components, the lead support member is configured as a pair of spaced apart lead abutment elements, an individual one of which 400 is diagrammatically illustrated in FIG. 13 as having a front wall 401 which intersects an inclined surface 403. From inclined surface 403, a horizontal surface 405, which serves as a transverse lead support rail, extends to a vertical wall portion 407. The intersection 411 of vertical wall portion 407 and horizontal surface 405 higher forms a ninety degree V against which transverse leads 321 of component 320 abut when the component is placed in position for lead formation. Inclined surface 403 serves to direct lead 321 up onto horizontal surface 405 so that is may be urged into place at intersection 411.

Figure 15:
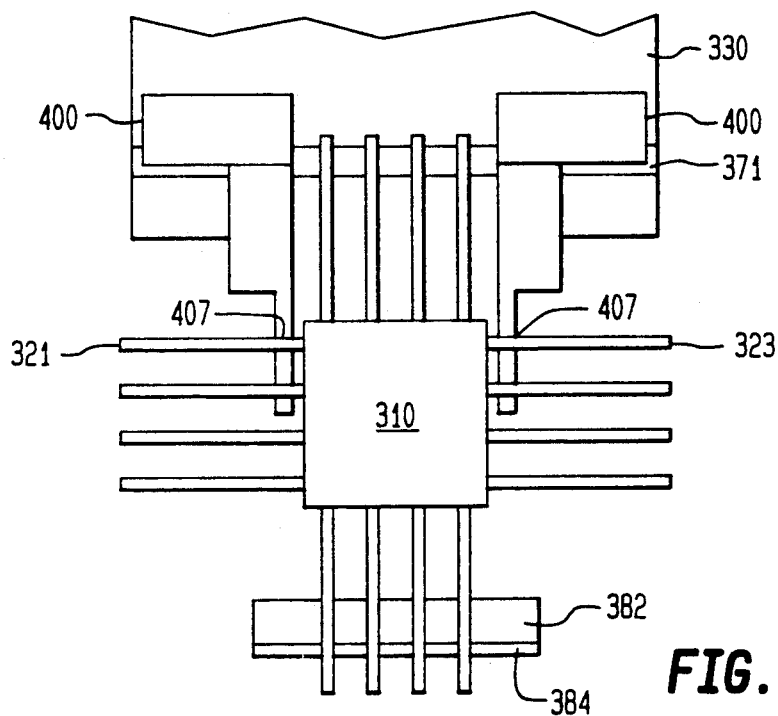
FIG. 15 diagrammatically illustrates how, for four sided lead components, two spaced apart lead abutment elements are arranged to support end leads extending from opposite sides of the component in a direction generally transverse to the direction of leads supported by an anvil rail.

Shuttle 330 is sufficiently wide to accommodate the spacing required between a pair of lead abutment elements that are dado joined to the top surface of the shuttle, as in the case of single lead support member for a two sided lead component, described above. Namely, as diagrammatically illustrated in FIG. 15, for four sided lead components two spaced apart lead abutment elements 400 are mounted to shuttle 330 and are arranged to support end ones of sets of leads 321, 323 extending from opposite sides 325, 327 of the component in a direction generally transverse to the direction of leads 320 that are supported by anvil rail 384.

Referring again to FIGS. 11 and 12, a lead-contouring block 392 is mounted to lower platen 380 abutting that side 396 of anvil block 382, so that the top surface 385 of anvil support rail 384 is vertically displaced by a side surface portion 389 above a land region 393 of lead-contouring block 392, thereby defining a gull-wing lead shaping surface, with the distance between top surface 385 and land region 393 corresponding to the total form height 40 shown in FIG. 1.

Except for the single rail and single abutting lead contouring block, vertically adjustable anvil 382 is configured as the anvil in the first embodiment and reference may be had to the above description. Briefly, anvil 382 has a lower surface inclined relative to its top surface and the anvil block is spring biased by a pair of springs against an inclined upper support surface of a horizontally displaceable height adjustment wedge member. The bottom surface of the wedge member is supported on the bottom horizontal surface of a groove in the lower support platen. Also, guide blocks, having inclined upper surfaces for guiding the lead forming unit, as will be described below are supported on the lower platen adjacent to lead-contouring block 392 and shuttle carriage mount block 351, so as to confine movement of the anvil block to the vertical direction.

As in the first embodiment, horizontal displacement of the height adjustment wedge member is controlled by way of a dial, which is coupled to one end of a threaded coupling shaft at a dial mount block, the other end of the threaded coupling shaft engaging the wedge member. Also, a digital gage is coupled to the dial and is calibrated in the units of the total form height to be imparted to the leads of an electronic component placed on anvil support rail 384. Thus, when an operator dials in the value read indicated by the digital gage of the total form height measuring device shown in FIG. 2, rotation of the dial and an associated threaded coupling shaft causes horizontal displacement of the (inclined support surface of) the height adjustment wedge member, so that anvil block 382 is vertically displaced to the requisite lead formation height. Although not required to facilitate ejection of a processed component from the anvil, anvil 382 may also include a vertically displaceable component ejector supported within a vertical bore of anvil the block adjacent support rail 384, as in the first embodiment described above.

Referring again to FIG. 11, mounted adjacent to anvil 382 and lead-contouring block 392 are a pair of lead forming unit guidance blocks 421, 422 which, as noted above, serve to both confine the movement of anvil block 382 to the vertical direction and, via upper inclined surfaces 425, 426, guide the downward travel path of a 'zero clearance' lead forming unit 510, which is mounted to an upper platen 430 upon which lead clamping, bending and trimming components of the system, diagrammatically shown in FIG. 16.

Referring to FIG. 16, located directly above and supported for controlled vertical displacement with respect to lower platen 380 is an upper platen 460. The clamping and die elements are contained within a lead clamping/forming unit 470 that is disposed between and partially supported by a pair of upper platen mounting blocks 466, 468 which are bolted to upper platen 460.

More particularly, lead clamping/forming unit 470 is comprised of a first upper platen mounting block 466 which is bolted to the bottom surface 461 of upper platen 460 and sets of threaded bores 475, 476 for receiving mounting bolts 477, 478 that are captured in a vertically adjustable collar 481 retained in an elongated vertical slot 483 within a lead clamp 485. The upper surface 487 of lead clamp 485 has an arrangement of cylindrical depressions 491 which receive lower ends of respective Belleville spring washers 493. Bottom surface 461 of upper platen 460 has a corresponding arrangement of cylindrical depressions 494 which receive upper ends respective ones of the Belleville spring washers 493. Just as in the first embodiment, lead clamp 485 is aligned with the support rail 384 of the anvil 382, such that when the upper platen is moved downward toward the lower platen, lead clamp 384 is urged against and clamps those leads of an electronic circuit component resting on the anvil support rail 384.

A 'zero clearance' lead forming unit 510 comprises a pivotable die member 511, which is mounted by means of pins 515, 516 for rotation within a recess 514 in the bottom surface 461 of upper support platen 460 as shown in FIG. 16 and in the enlarged partial bottom view of FIG. 17. Recess 514 is configured to accommodate the entire width of die member 511 such that the upper ends of its sidewalls fit within the recess. The upper surface 513 of die member 511 has a plurality of depressions which receive first ends of springs 517, second ends of which are captured within associated bores 518 in the upper surface of recess 514.

As further shown in FIG. 17, recess 514 also includes narrow pocket regions 514A, 514B which are offset from the geometrical axis of the die member and receive respective pins 515, 516 through which the upper end of the die member is pivotally retained within recess 514. Respective tabs 518 and 519 are mounted across pocket regions 514A, 514B at the bottom surface 461 of upper platen 460 so as to retain pins 515, within the pocket regions. Because pins 515, 516 are offset from the geometrical axis of die member 511, the die member is biased counter-clockwise about pins 515, 516 (as viewed in FIG. 16), so that a very narrow separation or spacing 520 (e.g. on the order of fifteen mils) is provided between die member 511 and lead clamp 485. The lower end of die member 511 has a foot 501 arranged adjacent to lead clamp 485.

Attached to sidewalls 512A, 512B of die member 511 are a pair of guide wheel units 503, 505 which contain wheels 522, 523 at their lower ends, such that the wheels are positioned to ride on the inclined guiding surfaces 425, 426 of the lead forming unit guidance blocks 421, 422 of the lower support platen. As a result, when upper platen 460 is translated downward toward the lower platen, wheels 522, 523 ride down the inclined guiding surfaces of blocks 421, 422. The inclined travel of wheels 522, 523 imparts a horizontal component to the movement of die member 511 toward anvil 382. Consequently, die foot 501 rotates clockwise as shown in FIG. 16 about pins 515, 516, so as to be urged into 'zero clearance' contact with free ends of leads clamped by lead clamp 485. Therefore, the free ends of the leads are clamped against sidewall 389 of the anvil and into contact with the land region 393 of lead-contouring block 392, thereby forming the clamped leads into a gull-wing configuration, as shown in the enlarged illustration of FIG. 18.

In order to trim the leads, a cutting blade element 521 is mounted to an interior face 523 of block 468, so as to be solid with upper platen 460 and disposed immediately adjacent die member 501. Cutting blade element 521 has a recessed lead cutting blade 531 inclined from a lower edges 533 to an upper edges 535. Once the leads have been bent into their gull-wing shape, as just described, continued downward movement of upper platen 460 brings recessed lead cutting blade 533 down onto the free ends of the bent leads that extend beyond the gull wing formed portions. Once the leads have been formed and trimmed in the manner just described, upper platen 460 is retracted, so that the component may be removed from the anvil. The part is then rotated 180° and the opposite side of the part is similarly processed. If the part has leads extending from only two opposite sides, processing of the part is completed. If the part has leads on all four sides, the part is rotated 90° and the leads of an adjacent side are formed and trimmed, followed by the processing of the leads of the fourth side of the component.

As will be appreciated from the foregoing description, the present invention provides a reduced complexity component measurement and associated lead formation system that provides high precision bending and trimming of offset leads for both two and four sided surface mount electronic circuit components. By means of a total form height measuring apparatus having a simplified mechanical structure the total form height of leads of an electronic component to be surface mounted to a printed circuit board are easily measured with high accuracy. Because the digital readout gage of the measuring device may be calibrated in accordance with a predefined separation or offset between the body of the electronic circuit component and a surface upon which the component is to be mounted, the indicated value is simply 'dialed' on a height setting control gage of an associated lead forming apparatus through which the leads of the electronic component are controllably bent and trimmed to faithfully conform with total form height measurement.

While we have shown and described several embodiments in accordance with the present invention, it is to be understood that the same is not limited thereto but is susceptible to numerous changes and modifications as known to a person skilled in the art, and we therefore do not wish to be limited to the details shown and described herein but intend to cover all such changes and modifications as are obvious to one of ordinary skill in the art.

What is claimed is:

1. A method of forming leads of an electronic component comprising the steps of:
    (a) providing a measuring device capable of measuring the total form height of leads of said electronic component and having a first gage including a digital readout that provides an indication of said form height;
    (b) placing an electronic component on said measuring device and measuring the total form height of leads of said electronic component, the measured total form height being indicated by said first gage;
    (c) providing a lead forming device having a total form height adjustment mechanism through which the total form height of leads of an electronic component placed thereon may be controllably adjusted in terms of the units of said first gage;
    (d) placing the electronic component, the total form height of the leads of which was measured in step (b), on said lead forming device;
    (e) setting the total form height adjustment mechanism of said lead forming device in accordance with the units indicated by said first gage; and
    (f) operating said lead forming device so as to shape the leads thereof to the total form height set in step (e).

2. A method according to claim 1, wherein the total form height adjustment mechanism of said lead forming device includes a second gage including a digital readout that provides an indication of the total form height of leads to be formed by said lead forming device in terms of the same units of said first gage.

3. A system for forming leads of an electronic component comprising:
    a measuring device which measures the total form height of leads of said electronic component placed thereon, said measuring device having a first digital readout gage that provides a digital indication of measured form height; and
    a lead forming device having a total form height adjustment mechanism through which the total form height of leads of an electronic component placed thereon are controllably adjusted, the total form height established by said total form height adjustment mechanism being digitally indicated, by a second digital readout gage coupled thereto, in terms of the same units of said first digital readout gage.

4. A measuring device for measuring the total form height of leads of an electronic component placed thereon, comprising:
    first and second horizontally adjustable support rails upon which the leads of an electronic component are placed so that said electronic component is supported between said support rails;
    a measuring unit mounted between said first and second support rails so as to engage said supported electronic component and measure a dimensional offset between said leads and a location on the body of said electronic component whereat said measuring unit engages said electronic component, said measuring unit containing a first digital readout gage which, when calibrated in accordance with a predefined separation between the body of said electronic circuit component and a surface upon which said electronic component is to be mounted, provides a digital indication of the total form height of the leads of said electronic component.

5. A lead forming apparatus for forming the leads extending from the body of an electronic circuit component into a gull-wing shape comprising:
    a lower support platen;
    a vertically adjustable anvil mounted on said lower support platen having first and second spaced apart support rails upon which the leads of an electronic component may be places, so that the body of said electronic component may be supported between said support rails with the leads of said electronic component resting on said support rails;

first and second lead-contouring surface members abutting first and second sides of said anvil such that said first support rail is vertically displaced above said first lead-contouring surface member and said second support rail is vertically displaced above said second lead-contouring surface member;

an upper support platen supported above said lower support platen;

a lead clamping unit supported by said upper support platen above said anvil and having first and second clamping surfaces aligned with the first and second support rails of said anvil, such that when said lead clamping unit is urged against said anvil, said first and second clamping surfaces clamp leads of an electronic circuit component supported on said support rails;

a lead forming unit, mounted to said upper support platen, said lead forming unit having first and second die members arranged adjacent to the first and second clamping surfaces of said clamping unit, so that when said lead clamping unit is urged against said anvil, said first and second die members are in position to become engaged with free ends of said leads and bend the free ends of said lead along the first and second sides of said anvil and into contact with said first and second lead-contouring surface members thereby forming each of said leads into a gull-wing configuration;

first and second lead cutting blades arranged adjacent to said first and second die members for severing free ends of said leads that extend beyond prescribed gull-wing configured portions thereof; and a digital gage coupled thereto for providing a digital indication of the total form height to be imparted to the leads of an electronic component when placed on the support rails of said vertically adjustable anvil based upon the vertical positioning of said support rails relative to said first and second lead-contouring surface members.

6. A lead forming apparatus according to claim 5, wherein said vertically adjustable anvil comprises a first, vertically displaceable anvil block having said first and second spaced apart horizontal support rails and a lower inclined support surface, and a second, horizontally displaceable height adjustment member having an upper inclined support surface upon which the lower inclined support surface of said vertically displaceable anvil block is supported, first and second guide members arranged in cooperation with said first and second lead-contouring surface members so as to confine movement of said first, vertically displaceable anvil block to the vertical direction, and means for controllably horizontally displacing said height adjustment member so that horizontal displacement of the inclined support surface thereof causes vertical displacement of said vertically displaceable anvil block.

7. A lead forming apparatus according to claim 6, wherein said vertically adjustable anvil further comprises a vertically displaceable component release member supported for vertical displacement with said first, vertically displaceable anvil block and arranged to be controllably vertically displaced between the first and second support rails of said anvil.

8. A lead forming apparatus according to claim 7, further including means, pivotally coupled with said vertically displaceable component release member, for controllably vertically displacing said component release member between the first and second support rails of said anvil.

9. A lead forming apparatus according to claim 6, wherein outer corners of said first and second support rails and inner corners of said first and second die members have a gently rounded curvature corresponding to a prescribed curvature of bend of said leads.

10. A lead forming apparatus according to claim 6, wherein said vertically adjustable anvil further includes means for spring-biasing said first, vertically displaceable anvil block against said second, horizontally displaceable height adjustment member so as to maintain the lower inclined support surface said vertically displaceable anvil block in contact with the upper inclined support surface of said second, horizontally displaceable height adjustment member.

11. A lead forming apparatus according to claim 6, wherein said lower support platen has a slot in which said second, horizontally displaceable height adjustment member is slidably supported for horizontal displacement therein beneath said vertically displaceable anvil block.

12. A system for forming leads of an electronic component comprising:

a total form height measuring apparatus which measures the total form height of leads of an electronic component placed thereon, said total form height measuring apparatus including first and second horizontally adjustable support rails upon which the leads of an electronic component are placed so that said electronic component is supported between said support rails, a measuring device mounted between said first and second support rails so as to engage said supported electronic component and measure a dimensional offset between said leads and a location on the body of said electronic component whereat said measuring device engages said electronic component, and a first digital readout gage which, when calibrated in accordance with a predefined separation between the body of said electronic circuit component and a surface upon which said electronic component is to be mounted, provides a digital indication of the total form height of the leads of said electronic component; and a lead forming apparatus having a total form height adjustment mechanism through which the total form height of leads of said electronic component placed thereon are controllably adjusted, the total form height established by said total form height adjustment mechanism being digitally indicated, by a second digital readout gage coupled thereto, in terms of the same units of said first digital readout gage, said lead forming apparatus comprising a lower support platen, a vertically adjustable anvil mounted on said lower support platen having first and second spaced apart support rails upon which the leads of an electronic component may be placed, so that the body of said electronic component may be supported between said support rails with the leads of said electronic component resting on said support rails, first and second lead-contouring surface members abutting first and second sides of said anvil such that said first support rail is vertically displaced above said first lead-contouring surface member and said second support rails is vertically displaced above said second lead-contouring surface member, an upper support platen supported above said lower support platen, a lead clamping unit supported by said upper support platen above said anvil and having first and second clamping surfaces aligned with the first and second support rails of said anvil, such that when said lead clamping unit is urged against said anvil, said first and second clamping surfaces clamp leads of an electronic circuit component supported on said support rails, a lead forming unit, mounted to said upper support platen, said lead forming unit having first and second die members arranged adjacent to the first and second clamping surfaces of said clamping unit, so that when said lead clamping unit is urged against said anvil, said first and second die members are in position to become engaged with free ends of said leads and bend the free ends of said leads along the first and second sides of said anvil and into contact with said first and second lead-contouring surface members thereby forming each of said leads into a gull-wing configuration, and first and second lead cutting blades arranged adjacent to said first and second die members for severing free ends of said leads that extend beyond prescribed gull-wing configured portions thereof.

13. A system according to claim 12, wherein said vertically adjustable anvil comprises a first, vertically displaceable anvil block having said first and second spaced apart horizontal support rails and a lower inclined support surface, and a second, horizontally displaceable height adjustment member having an upper inclined support surface upon which the lower inclined support surface of said vertically displaceable anvil block is supported, first and second guide members arranged in cooperation with said first and second lead-contouring surface members so as to confine movement of said first, vertically displaceable anvil block to the vertical direction, and means for controllably horizontally displacing said height adjustment member so that horizontal displacement of the inclined support surface thereof causes vertical displacement of said vertically displaceable anvil block.

14. A system according to claim 13, wherein said vertically adjustable anvil further comprises a vertically displaceable component release member supported for vertical displacement with said first, vertically displaceable anvil block and arranged to be controllably vertically displaced between the first and second support rails of said anvil.

15. A system according to claim 14, further including means, pivotally coupled with said vertically displaceable component release member, for controllably vertically displacing said component release member between the first and second support rails of said anvil.

16. A system according to claim 13, further including a digital gage coupled thereto for providing a digital indication of the total form height to be imparted to the leads of an electronic component when placed on the support rails of said vertically adjustable anvil based upon the vertical positioning of said support rails relative to said first and second lead-contouring surface members.

17. A system according to claim 13, wherein outer corners of said first and second support rails and inner corners of said first and second die members have a gently rounded curvature corresponding to a prescribed curvature of bend of said leads.

18. A system according to claim 13, wherein said vertically adjustable anvil further includes means for spring-biasing said first, vertically displaceable anvil block against said second, horizontally displaceable height adjustment member so as to maintain the lower inclined support surface of said vertically displaceable anvil block in contact with the upper inclined support surface of said second, horizontally displaceable height adjustment member.

19. A system according to claim 13, wherein said lower support platen has a slot in which said second, horizontally displaceable height adjustment member is slidably supported for horizontal displacement therein beneath said vertically displaceable anvil block.

20. A lead forming apparatus for forming the leads extending from the body of an electronic circuit component into a gull-wing shape comprising:

a lower support platen;

a vertically adjustable anvil mounted to said lower support platen and having a first support rail upon which leads extending from a first side of an electronic component may be placed;

a horizontally adjustable lead support member mounted to said lower support platen and having a second support rail upon which leads extending from a second side of said electronic component may be placed, so that the body of said electronic component may be supported between said first and second support rails with the leads of said electronic component resting on said support rails;

a lead-contouring surface member abutting said anvil such that said first support rail is vertically displaced above said lead-contouring surface member;

an upper support platen supported above said lower support platen;

a lead clamping unit supported by said upper support platen above said anvil and having a lead clamping member aligned with the first support rail of said anvil, such that when said lead clamping unit is urged against said anvil, said lead clamping member is urged against and clamps leads of an electronic circuit component resting on said first support rail;

a lead forming unit, mounted on said upper support platen, said lead forming unit having a die member arranged adjacent to the lead clamping member of said lead clamping unit, and means for imparting a horizontal movement to said die member during downward movement of said lead forming unit toward said anvil and lead-contouring surface member, such that, as said lead clamping unit is urged into engagement with said anvil, said die member is in position to be urged against free ends of clamped leads and bend the free ends of said leads against a side of said anvil and into contact with said lead-contouring surface member, thereby forming each of said clamped leads into a gull-wing configuration; and a lead cutting blade arranged adjacent to said die member for severing free ends of said clamped leads that extend beyond prescribed gull-wing configured portions thereof.

21. A lead forming apparatus according to claim 20, wherein said anvil comprises
- a vertically displaceable anvil block containing said first support rail and a lower inclined support surface,
- a horizontally displaceable height adjustment member having an upper inclined support surface upon which the lower inclined support surface of said vertically displaceable anvil block is supported.
- first, second and third guide members arranged in cooperation with said lead-contouring surface member, so as to confine movement of said vertically displaceable anvil block to the vertical direction, and
- means for controllably horizontally displacing said height adjustment member so that horizontal displacement of the inclined support surface thereof causes vertical displacement of said vertically displaceable anvil block.

22. A lead forming apparatus according to claim 21, further including a digital gage coupled thereto for providing a digital indication of the total form height to be imparted to the leads of an electronic component when placed on said first support rail of said vertically adjustable anvil based upon the vertical positioning of said first support rail relative to said lead-contouring surface member.

23. A lead forming apparatus according to claim 21, wherein outer corners of said support rail and an inner corner of said die member have a gently rounded curvature corresponding to a prescribed curvature of bend of said clamped leads.

24. A lead forming apparatus according to claim 21, wherein said vertically adjustable anvil further includes means for spring-biasing said vertically displaceable anvil block against said horizontally displaceable height adjustment member so as to maintain the lower inclined support surface of said vertically displaceable anvil block in contact with the upper inclined support surface of said horizontally displaceable height adjustment member.

25. A lead forming apparatus according to claim 24, wherein said lower support platen has a slot in which said horizontally displaceable height adjustment member is slidably supported for horizontal displacement thereon beneath said vertically displaceable anvil block.

26. A lead forming apparatus according to claim 20, further comprising a lead forming unit guidance member, mounted to said lower surface platen adjacent to said anvil and said lead-contouring surface member, and said lead forming unit includes means for engaging said lead forming unit guidance member and causing a horizontal movement component to be imparted to said die member during downward movement of said lead forming unit toward said anvil and lead-contouring surface member, such that, as said lead clamping unit engages said lead forming unit guidance member, said die member is guided against free ends of clamped leads and bends the free ends of said leads against a side of said anvil and into contact with said lead-contouring surface member, thereby forming each of said clamped leads into a gull-wing configuration.

27. A lead forming apparatus according to claim 26, wherein said lead forming unit guidance member has an inclined guiding surface along which said lead forming unit travels during downward movement of said lead forming unit toward said anvil, thereby guiding said die member toward said anvil and lead-contouring surface member, such that, as said lead clamping unit engages said lead forming unit guidance member, said die member is guided into zero clearance engagement against free ends of clamped leads and bands the free ends of said leads against a side of said anvil and into contact with said lead-contouring surface member, thereby forming each of said clamped leads into a gull-wing configuration.

28. A lead forming apparatus according to claim 27, wherein a first portion of said die member is pivotally coupled to said upper support platen and a second portion of said die member is configured to ride on the inclined guiding surface of said lead forming unit guidance member.

29. A lead forming apparatus according to claim 20, wherein said horizontally adjustable lead support member includes a horizontally translatable support shuttle member arranged to be horizontally translatable with respect to said vertically adjustable anvil and supporting said second support rail upon which leads extending from a second side of said electronic component may be placed, so that the body of said electronic component may be supported at its lead by said first and second support rails.

30. A lead forming apparatus according to claim 20, wherein said horizontally adjustable lead support member contains a pair of second, spaced apart lead support rails arranged to support leads extending from a second side of said electronic component in a direction generally transverse to the direction of leads extending from said first side of said electronic component.

31. A lead forming apparatus according to claim 20, wherein the second support rail of said horizontally adjustable lead support member is arranged to support leads extending from a second side of said electronic component in a direction generally parallel to the direction of leads extending from said first side of said electronic component.

32. A lead forming apparatus for forming the leads extending from the body of an electronic circuit component into a gull-wing shape comprising:
- a first support body;
- a vertically adjustable anvil mounted to said first support body and having a first lead support rail upon which leads extending from a first side of an electronic component may be placed;
- a second lead support rail supported by said first support body and arranged to support leads extending from a second side of said electronic component, so that the body of said electronic component may be supported between said first and second support rails with the leads of said electronic component placed on said support rails;
- a lead-contouring surface member abutting said anvil such that said lead-contouring surface member is vertically displaced below said first support rail;
- a second support body positioned above said first support body;
- a lead clamping unit mounted to said second support body above said anvil and having a lead clamping member aligned with the first support rail of said anvil, such that when said lead clamping unit is urged against said anvil, said lead clamping member is urged against and clamps leads of an electronic circuit component resting on said first support rail;

a lead forming unit, mounted to said second support body, said lead forming unit having a die member arranged adjacent to the lead clamping member of said lead clamping unit, and means for imparting a horizontal component of movement to said die member during movement of said lead forming unit toward said anvil and lead-contouring surface member, such that, as said lead clamping unit is urged into engagement with said anvil, said die member is in position to be urged against free ends of clamped leads and bend the free ends of said leads against a side of said anvil and into contact with said lead-contouring surface member, thereby forming each of said clamped leads into a gull-wing configuration; and, a lead cutting blade arranged adjacent to said die member for severing free ends of said clamped leads that extend beyond prescribed gull-wing configured portions thereof.

33. A lead forming apparatus according to claim 32, further comprising a lead forming unit guidance member, mounted to said first support body adjacent to said anvil and said lead-contouring surface member, and said lead forming unit includes means for engaging said lead forming unit guidance member and causing a horizontal movement component to be imparted to said die member during movement of said lead forming unit toward said anvil and lead-contouring surface member, such that, as said lead clamping unit engages said lead forming unit guidance member, said die member is guided against free ends of clamped leads and bends the free ends of said leads against a side of said anvil and into contact with said lead-contouring surface member, thereby forming each of said clamped leads into a gull-wing configuration.

34. A lead forming apparatus according to claim 33, wherein said lead forming unit guidance member has an inclined guiding surface along which said lead forming unit travels during downward movement of said lead forming unit toward said anvil, thereby guiding said die member toward said anvil and lead-contouring surface member, such that, as said lead clamping unit engages said lead forming unit guidance member, said die member is guided into zero clearance engagement against free ends of clamped leads and bends the free ends of said leads against a side of said anvil and into contact with said lead-contouring surface member, thereby forming each of said clamped leads into a gull-wing configuration.

35. A lead forming apparatus according to claim 34, wherein a first portion of said die member is pivotally coupled to said upper support platen and a second portion of said die member is configured to ride on the inclined guiding surface of said lead forming unit guidance member.

36. A lead forming apparatus according to claim 32, further including a third lead support rail spaced apart from said second lead support rail and arranged in cooperation therewith to support leads extending from a second side of said electronic component in a direction generally transverse to the direction of leads extending from said first side of said electronic component.

* * * * *